US005153440A

United States Patent [19]

Yasaka

[11] Patent Number: 5,153,440

[45] Date of Patent: Oct. 6, 1992

[54] METHOD OF STABILIZING OPERATION FOR A LIQUID METAL ION SOURCE

[75] Inventor: Anto Yasaka, Tokyo, Japan

[73] Assignee: Seiko Instruments, Inc., Tokyo, Japan

[21] Appl. No.: 679,861

[22] Filed: Apr. 3, 1991

[30] Foreign Application Priority Data

Apr. 4, 1990 [JP] Japan .................................. 2-91241

[51] Int. Cl.[5] ............................................ H01J 37/08

[52] U.S. Cl. ................................ 250/424; 250/423 R; 250/423 F

[58] Field of Search ............... 250/423 R, 423 F, 424, 250/425; 313/362.1

[56] References Cited

U.S. PATENT DOCUMENTS

| | | | |
|---|---|---|---|
| 4,686,414 | 8/1987 | McKenna et al. | 250/423 R |
| 4,946,706 | 8/1990 | Fukuda | 427/35 |
| 4,994,711 | 2/1991 | Matossian | 250/423 R |
| 5,015,862 | 5/1991 | Holmes et al. | 250/423 R |

*Primary Examiner*—Bruce C. Anderson

*Attorney, Agent, or Firm*—Spensley Horn Jubas & Lubitz

[57] ABSTRACT

A method of stabilizing the operation of a liquid metal ion source in a focussed ion beam apparatus, the ion source being composed of a metal needle having a pointed downstream end and a lateral surface, a reservoir for supplying a liquid metal to the surface of the needle, a device for heating the metal, an extraction electrode having a small aperture disposed at a position opposite the metal needle for allowing an ion current to pass through the aperture, and a circuit for applying a voltage between the metal needle and the extraction electrode. According to the method the temperature of the liquid metal in the reservoir is normally maintained at a first value corresponding to a usual operating temperature value, and the temperature of the liquid metal is temporarily raised to a second value higher than the first value, by operation of the heating device, in order to maintain stable long term operation of the ion source. In addition, the extraction voltage may be temporarily raised together with or independently of the temperature raising operation.

5 Claims, 2 Drawing Sheets

METHOD OF STABILIZING OPERATION FOR A LIQUID METAL ION SOURCE

BACKGROUND OF THE INVENTION

The present invention concerns a liquid metal ion source used for a focused ion beam (FIB) device.

FIG. 1 is a block diagram showing one example of a liquid metal ion source and a control circuit. The ion source comprises a reservoir 1, a filament heater 2, a metal needle 13 and an extraction electrode 3. The liquid metal 14 stored in the reservoir 1 is maintained at a temperature higher than the melting point by the heater 2 and a heater Controller 7 is supplied to the needle 13.

An extraction voltage applied between metal needle 13 and extraction electrode 3 forms an intense electric field near the center of needle 13 to lead out the liquid metal in an ionized state. The ions pass through a small aperture in extraction electrode 3 and are accelerated by a grounded acceleration electrode 4. An acceleration voltage is applied between needle 13 and the acceleration electrode 4 by an acceleration voltage controller 12. The thus led out ions form a beam 6 and are introduced through a small aperture disposed in the acceleration electrode 4 to an FIB optical system.

A monitor aperture 5 is disposed at the FIB optical system, and the amount of ions flowing therethrough is detected by means of a current detector device 10 connected to the monitor aperture 5.

Control for the liquid metal ion source is fed back to the extraction voltage such that the amount of ions flowing into the monitor aperture 5 provided in the vicinity of the ion beam axis is maintained constant. In other words, a feedback controller 9 controls the extraction voltage generated by the extraction controller 8 such that the current detected at monitor aperture 5 and by current detector 10 is maintained constant.

An example of monitoring extraction voltage changes with time is shown in FIGS. 2(*a*) and 2(*b*). The region A shows a stable operation state which gives no problem for utilization as a FIB. The region B shows an unstable state and, since the extraction voltage changes in accordance with the variation of the amount of released ions, the tracks of the ion beam are changed and the imaginary image position is changed. Those changes prevent satisfactory functioning of the FIB device.

It is assumed that the unstable operation as in the case of the region B in FIG. 1(*a*) is attributable to a insufficient supply of liquid metal 14 to the needle 13 as an ion generation point in FIG. 1, which reduces the ion emission level and elevates the extraction voltage.

It is considered that the amount of liquid metal supplied changes for the following reasons. Ions led out from the vicinity of the tip of the needle 13 collide against the extraction electrode 3 or other electrodes, whereupon metal atoms (or molecules) emitted by sputtering caused by the collision are vapor deposited on the needle tip or the surface of the liquid metal, and/or residual gas molecules or other obstacles are absorbed and deposit on the needle tip or the surface of the liquid metal at the tip to form contaminations. The above phenomena increase the flow resistance encountered by liquid metal flowing along the surface layer of needle 13 near the tip.

Further, mixing of such a liquid metal with a different kind of metal causes the melting point or the viscosity to change, resulting in failure to obtain a stable ion beam, and, in an extreme case, termination of generation of ions per se.

It might be noted that as concerns the operating metal ion source used in FIB apparatus, a lower emission current (0.1 to 10 $\mu$A) and lower temperature (about from melting point to +200° C.) are advantageous for obtaining a beam diameter of sub-micron order since the spread of energy is small, as described in the literature "J. Appl. Phys. 51, 3453–3455 (1980)". The emission current is the sum of the ion beam current and is detected by an emission current detector 11 connected with the acceleration controller 12. In particular, in the case of an FIB mask repair apparatus or an FIB device fabrication apparatus, the acceleration voltage applied between the needle 13 and the acceleration electrode 4 is within a range between several kV and several tens kV; this is an indispensable operation condition.

However, in the operation under such conditions of low emission and low temperature, the liquid metal 14 flows slowly along the needle tip and many impurities are likely to be absorbed or vapor deposited. That is, the above mentioned conditions would likely cause unstable operation.

SUMMARY OF THE INVENTION

It is an object of the present invention to provide a method capable of stabilizing operating conditions at the needle tip.

Other and further objects, features and advantages of the invention will appear more fully from the following description.

For attaining a stable ion source operation over a long period of time, the present invention maintains the temperature of the ion source properly at higher temperature than that for usual operating conditions and, at the same time or independent thereof, controls the extraction voltage such that the emission of ions is greater than under usual conditions.

Contaminations are flushed out and the needle tip is kept clean by keeping the ion source at a high temperature for easy evaporation of absorbed materials and leading out a great amount of emissions of ions by applying the extraction voltage while reducing the flow resistance and the viscosity of the liquid metal by the above-mentioned operations.

DESCRIPTION OF PREFERRED EMBODIMENTS

Figure 1:
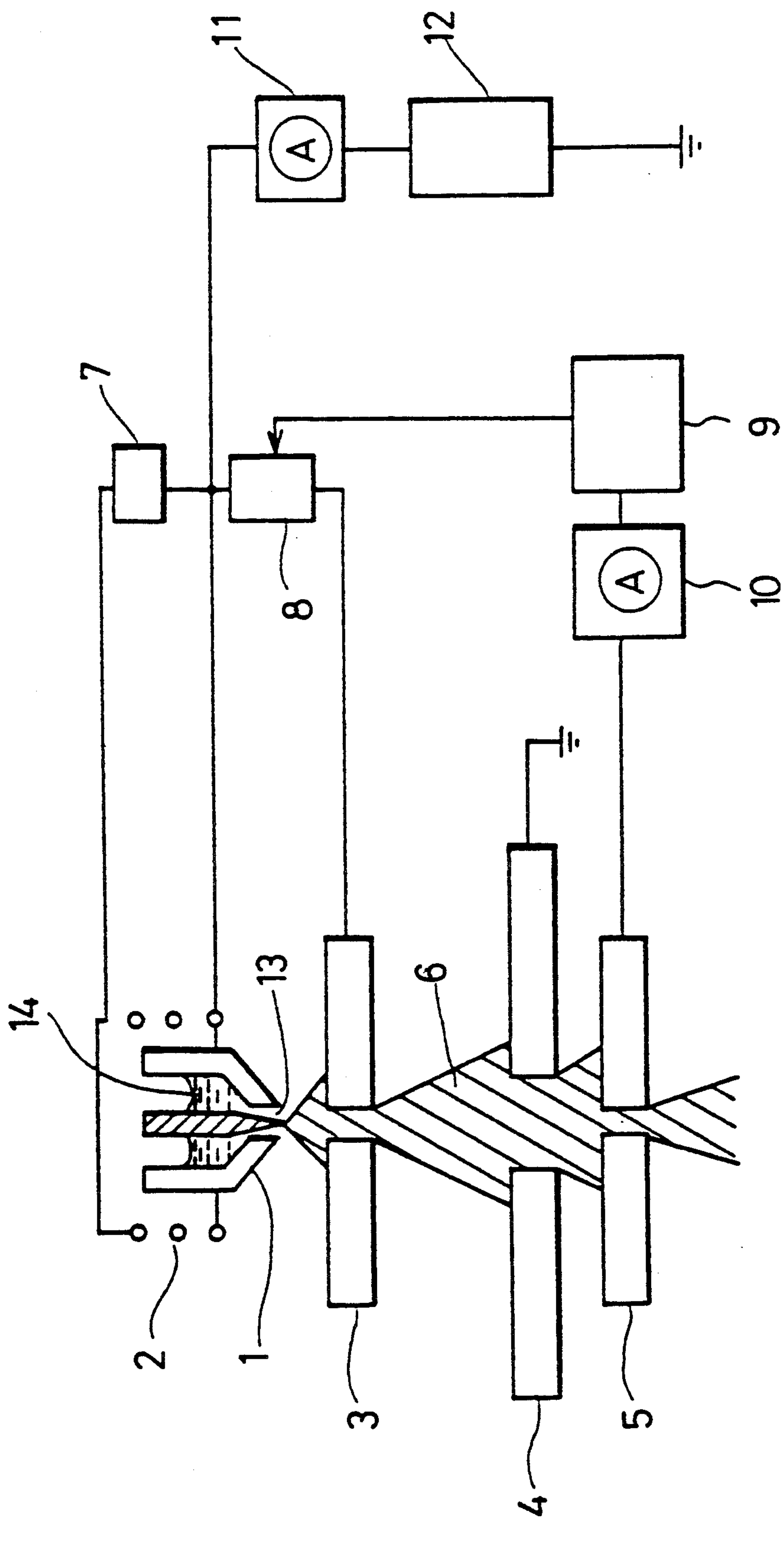
FIG. 1 shows one example of a liquid metal ion source, and control circuit which may be employed to practice the invention.

The operating conditions for a liquid metal ion source for obtaining satisfactory FIB operation as described above are within a range from 0.1 to 10 $\mu$A for the emission current and an operating temperature of about 30° to 190° C., for example in case of a Ga ion source. The metal ion source is controlled by feedback control of voltage such that the amount of ions flowing into the monitor aperture 5 is constant, as described earlier during operation of the metal ion source, the extraction voltage is monitored by a voltage meter (not shown in FIG. 1) provided in the extraction voltage controller 8.

When the extraction voltage rises abnormally, such as in the region B of FIGS. 2(*a*) and 2(*b*), the stabilization operation according to this invention is applied to the liquid metal ion source as follows. When the extraction voltage rises, the liquid metal 14 is heated by the heater 2 to be higher than 400° C. for 1-5 min., and the extraction voltage is raised by the extraction voltage controller 8 so as to raise the emission current to 50-200 μA while keeping the high temperature. The emission current is detected by emission current detector 11. By the above-described stabilizing operation, contaminations near the tip of the needle 13 are substantially eliminated to obtain a clean liquid metal surface to thereby enable stable ion operation.

Figure 2A:
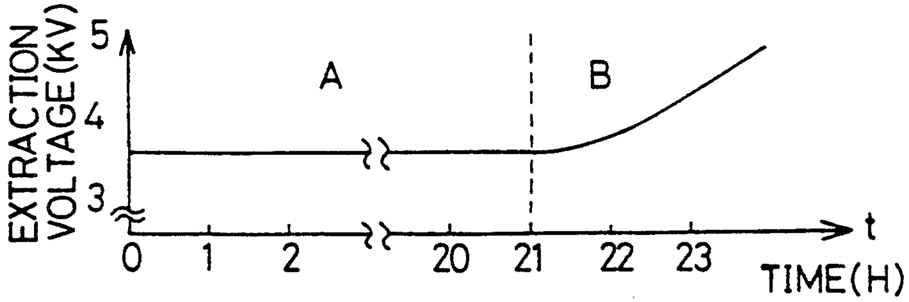
FIGS. 2(*a*) and 2(*b*) show examples of change with time of the extraction voltage upon feedback control for the liquid metal ion source.
Figure 2B:
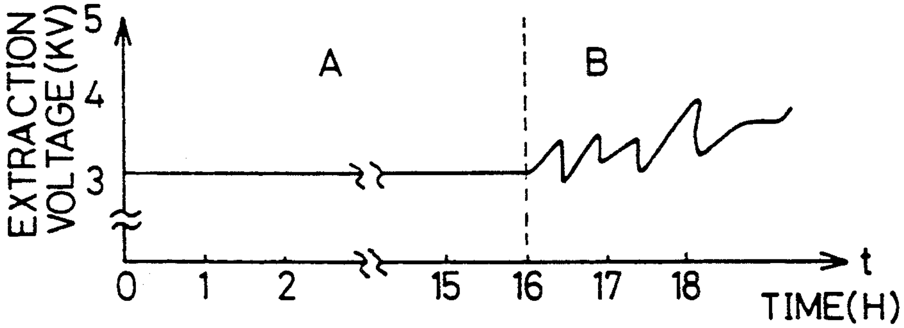
Figure 3:
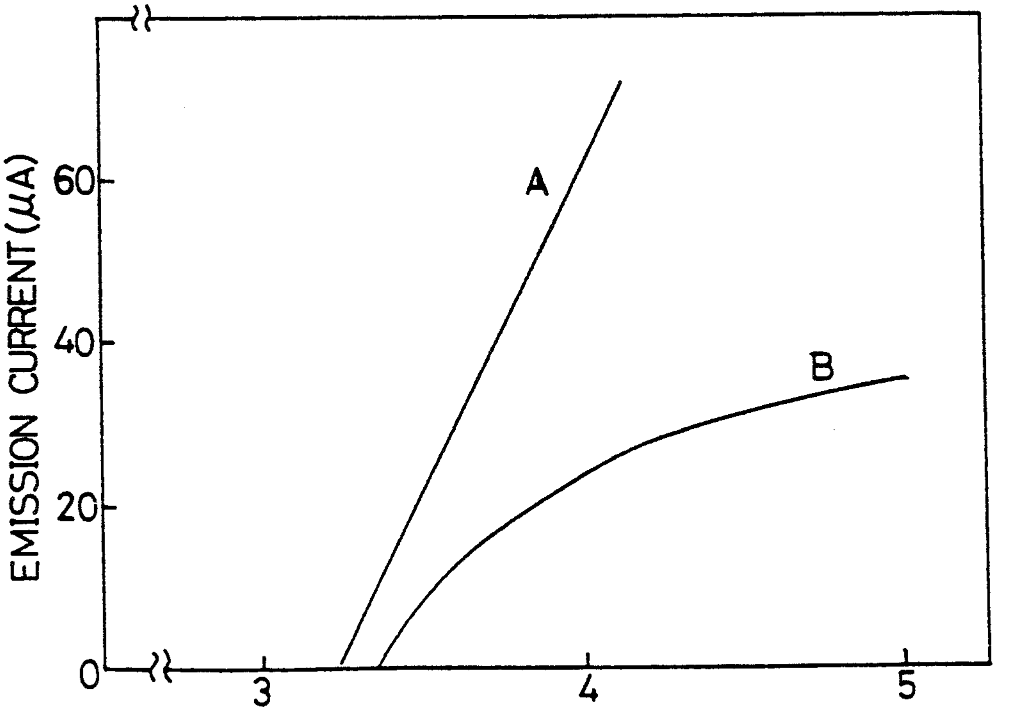
FIG. 3 shows examples of the relation between extraction voltage and emission current for a liquid metal ion source.

FIG. 3 shows an example of the V-I characteristic between extraction voltage and emission current during stable operation (region A in FIG. 2) and unstable operation (region B in FIG. 2).

When the stabilizing operation according to the present invention is applied, the V-1 characteristic of the liquid metal ion source is shifted from the state B shown in FIG. 3 to state A shown in FIG. 3. That is, when the extraction voltage is made higher while keeping ordinary temperature (for example 30-200°C.), it can be detected that the emission current is increased and the adequacy of the stabilizing operation can be judged.

Further, if such a stabilizing operation is conducted regularly, for example, once every 8 hours, unstable operation can be prevented beforehand. Furthermore, by properly measuring the V-I characteristic as shown in FIG. 3, it can be judged whether the stabilizing operation is required or not.

According to the present invention, it is possible to stably maintain the operation of a liquid metal ion source used for FIB apparatus for a long period of time, and unstable operation can be forestalled.

This application relates to the subject matter disclosed in Japanese Application 2-91241, filed on Apr. 4, 1990, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and the spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of stabilizing the operation of a liquid metal ion source in a focussed ion beam apparatus, the ion source being composed of a metal needle having a pointed downstream end and a lateral surface of said needle, means for having heating the metal, an extraction electrode having a small aperture disposed at a position opposite said metal needle for allowing an ion current to pass through the aperture, and means for applying a voltage between said metal needle and said extraction electrode, said method comprising:

normally maintaining the temperature of the liquid metal in the reservoir at a first value corresponding to a usual operation temperature value, and temporarily raising the temperature of the liquid metal to a second value higher than the first value, by operation of the heating means, in order to maintain stable long term operation of the ion source;

establishing an extraction voltage between the extraction electrode and the needle; normally maintaining the extraction voltage at a first value corresponding to a usual operating value; and temporarily raising the extraction voltage to a second value higher than the first value for temporarily increasing the ion current.

2. A method as claimed in claim 1 wherein the second extraction voltage value produces a ion current of greater than 20 μA.

3. A method as claimed in claim 1 further comprising monitoring the extraction voltage and ion current to determine the time for performing at least one of said steps of temporarily raising.

4. A method as claimed in claim 1 wherein the second temperature value is higher than 200° C.

5. A method as claimed in claim 1 wherein said step of temporarily raising the temperature is performed periodically.

* * * * *